(12) United States Patent
Lu

(10) Patent No.: US 7,512,855 B2
(45) Date of Patent: Mar. 31, 2009

(54) SHIFT REGISTER CIRCUIT

(75) Inventor: Shi-Hsiang Lu, Taipei (TW)

(73) Assignee: Au Optronics Corp., Hsin-chu (TW)

( * ) Notice: Subject to any disclaimer, the term of this patent is extended or adjusted under 35 U.S.C. 154(b) by 404 days.

(21) Appl. No.: 11/501,796

(22) Filed: Aug. 10, 2006

(65) Prior Publication Data
US 2007/0061651 A1   Mar. 15, 2007

(30) Foreign Application Priority Data
Aug. 12, 2005   (TW) .............................. 94127641 A (51) Int. Cl.
*G01R 31/28*   (2006.01)
(52) U.S. Cl. .......................... 714/731; 345/87; 345/98; 345/99
(58) Field of Classification Search ................. 345/100, 345/92, 103, 87, 99, 98; 714/731
See application file for complete search history.

(56) References Cited

U.S. PATENT DOCUMENTS

| | | | |
|---|---|---|---|
| 6,963,328 B2* | 11/2005 | Kang et al. ................. 345/100 |
| 6,999,053 B2* | 2/2006 | Lee et al. ..................... 345/92 |
| 7,006,072 B2* | 2/2006 | Ahn ........................... 345/103 |
| 7,030,844 B2* | 4/2006 | Kang et al. .................... 345/87 |
| 7,038,652 B2* | 5/2006 | Kang et al. .................... 345/98 |
| 7,446,748 B2* | 11/2008 | Jang et al. ................... 345/100 |
| 2003/0169223 A1* | 9/2003 | Lee et al. ..................... 345/92 |
| 2005/0052385 A1* | 3/2005 | Noda ........................... 345/87 |
| 2005/0285840 A1* | 12/2005 | Jang et al. ................... 345/100 |

* cited by examiner

*Primary Examiner*—David Ton
(74) *Attorney, Agent, or Firm*—Birch, Stewart, Kolasch & Birch, LLP (57) ABSTRACT

A shift register circuit which having a plurality of stages, a signal of the timing controller is conveyed to the shift register circuit for generating and transferring a sample signal to data latch circuit. The first stage of the shift register, comprising a disable circuit and a sample circuit, receives the signal of the timing controller and transfers a right sample signal to the data latch circuit and next stage of the shift register. The disable circuit of first stage of the shift register receives sample signal of second stage of the shift register to stop the sampling procedure of the first stage of the shift register.

14 Claims, 8 Drawing Sheets

SHIFT REGISTER CIRCUIT

FIELD OF THE INVENTION

The present invention relates to a shift register circuit, especially to a shift register circuit which could output synchronous signals.

DESCRIPTION OF THE PRIOR ART

Figure 1:
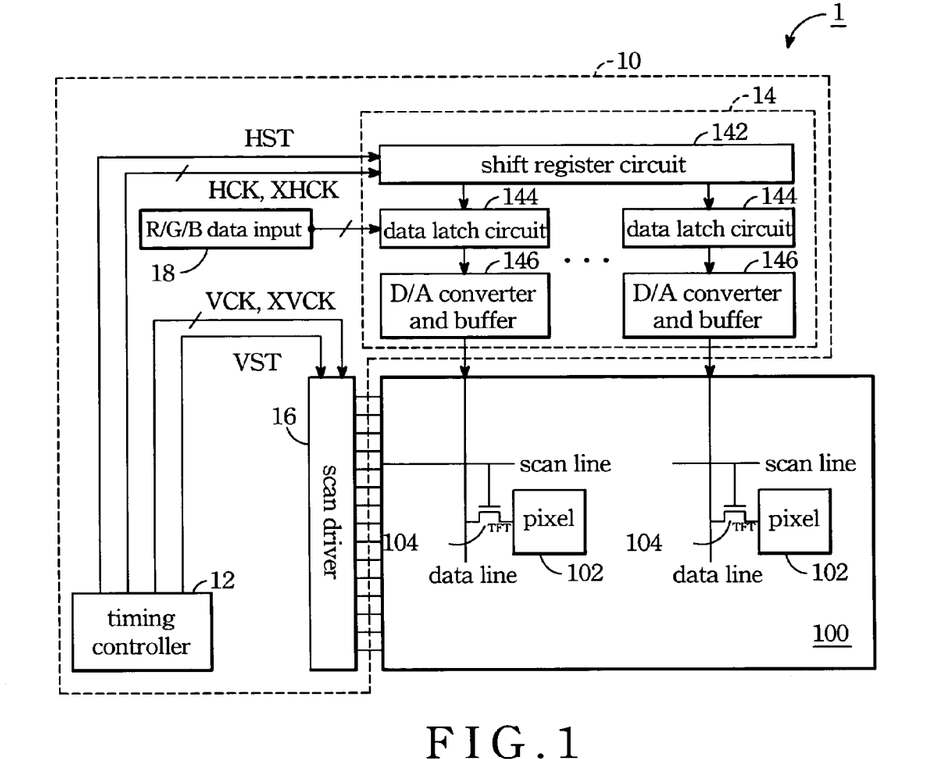
FIG. 1 shows a circuit diagram of an active matrix liquid crystal display (AMLCD) 1.

Please refer to FIG. 1, which shows a circuit diagram of an active matrix liquid crystal display (AMLCD) 1, which comprises a driving system 10 and a LCD panel 100.

As FIG. 1 shows, the driving system 10 comprises a timing controller 12, a data driver 14, a scan driver 16 and an RIG/B data input 18. The timing controller 12 generates a horizontal clock signal (called as HCK hereinafter) and a horizontal start clock signal (called as HST hereinafter) to the data driver 14, and generates a vertical clock signal (called as VCK hereinafter) and a vertical start signal (called as VSK hereinafter) to the scan driver 16 in the meantime, and the R/G/B data input 18 is used for transferring a display data D to the data driver 14.

The data driver 14 comprises a shift register 142, a plurality of data latch circuits 144, a plurality of D/A converters and buffer circuits 146. The shift register 142 further comprises a plurality stages, the stages are used for receiving the HCK and the HST, generating corresponding sample signals and feeding these sample signals sequentially into the data latch circuits 144, the D/A converter, buffer circuits 46 and a pixel element 102.

The LCD display 100 comprises a pixel array having a plurality of pixel elements 102. Every pixel element is electrically connected to a thin-film transistor (called as TFT hereinafter). The source of the TFT 104 is electrically connected to the data driver 14 and the drain of the TFT 104 is electrically connected to the scan driver 16 to form a switch for controlling operation of the pixel element 102.

Figure 2:
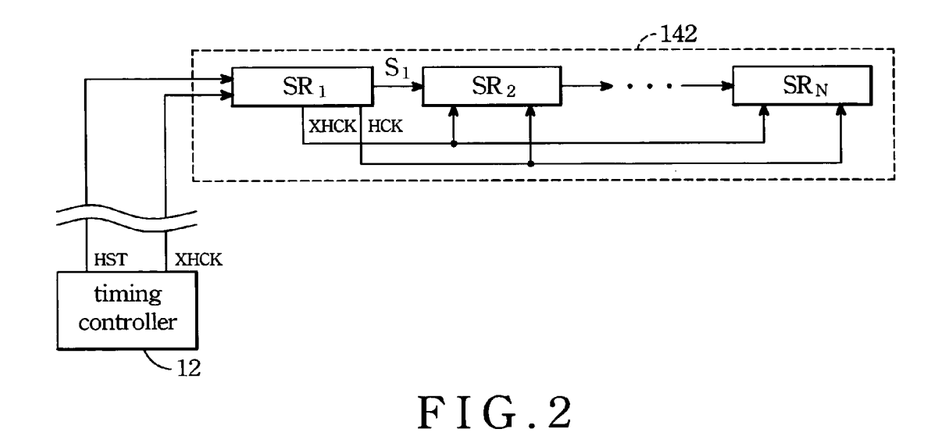
FIG. 2 shows a diagram of a conventional shift register circuit 142.

Please refer to FIG. 2, which shows a diagram of a conventional shift register circuit 142. The shift register circuit comprises a plurality of stages, a first stage $SR_1$ generates a sample signal $S_1$ that controlled by the HST and the reverse horizontal clock signal (called as XHCK hereinafter) from the timing driver 12, and then the sample signal $S_1$ is fed into the data latch circuits 144 and a second stage $SR_2$. A $N_{th}$ stage $SR_N$ generates a sample signal $S_N$ that controlled by a sample signal $S_{N-1}$ of the (N−1)th stage, the HST and the reverse horizontal clock signal (called as XHCK hereinafter) from the timing driver 12; and then the sample signal $S_N$ is fed into the data latch circuits 144 and a (N+1)$_{th}$ stage $SR_{N+1}$.

Figure 3A:
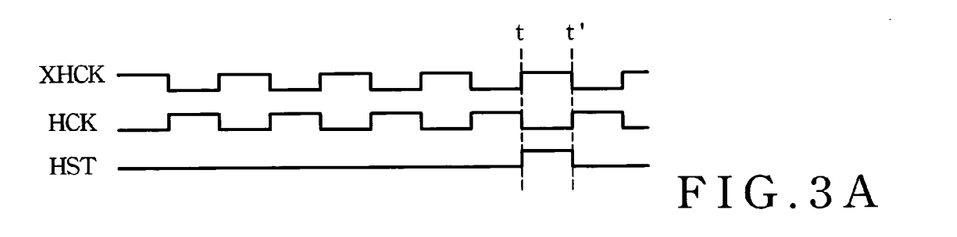
FIG. 3A shows a timing diagram of the HCK, XHCK and HST of the timing controller 12.
Figure 3B:
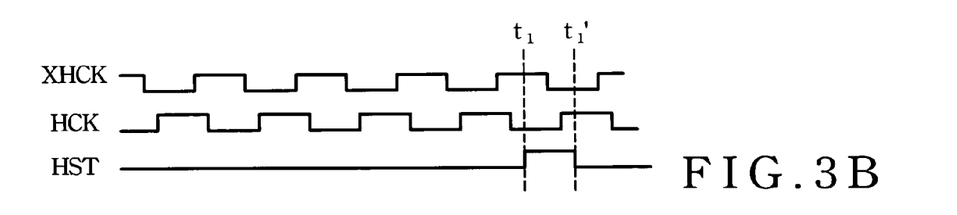
FIG. 3B shows a timing diagram of the data driver 14.

Please refer to FIG. 3A and FIG. 3B, FIG. 3A shows a timing diagram of the HCK, XHCK and HST of the timing controller 12; and FIG. 3B shows a timing diagram of the data driver 14. As FIG. 3A shows, the HCK, XHCK and HST are synchronous clock is ideal situation, between a time section t to t', the data driver 14 could extract XHCK that cover with 50% period as a working period of controlling signals.

However, the output synchronous clock arrives the data driver 14 through different routes with different parasitic capacitance and parasitic resistance, hence an asynchronous phenomenon will appear while the output synchronous signals arrives the data driver 14 in reality, as shown in FIG. 3B. The data driver won't maintain to extract an overlapping 50% period signal because the asynchronous phenomenon of the HST and the HCK, the XHCK. An output glitch signal will make related circuits failing and effecting normal operation.

Figure 3C:
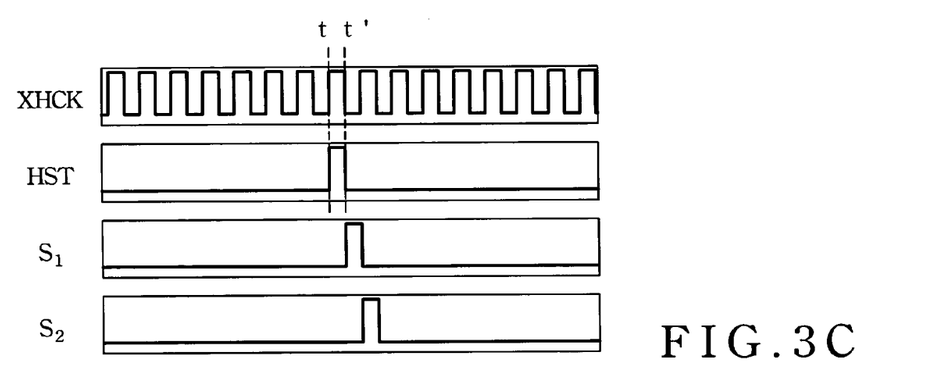
FIG. 3C is a ideal timing diagram of an input and an output circuits of a shift register circuit.

Please refer to FIG. 3C, which is an ideal timing diagram of an input and an output circuits of a shift register circuit. During a tome section t to t', a first stage of the shift register circuit receives the HST as a pulse input and extracts the XHCK to generate a sample signal $S_1$, then the sample signal $S_1$ is outputted to a corresponding data latch circuit and a second stage $SR_2$. The sample signals of every stage are outputting and carried in turn.

Figure 3D:
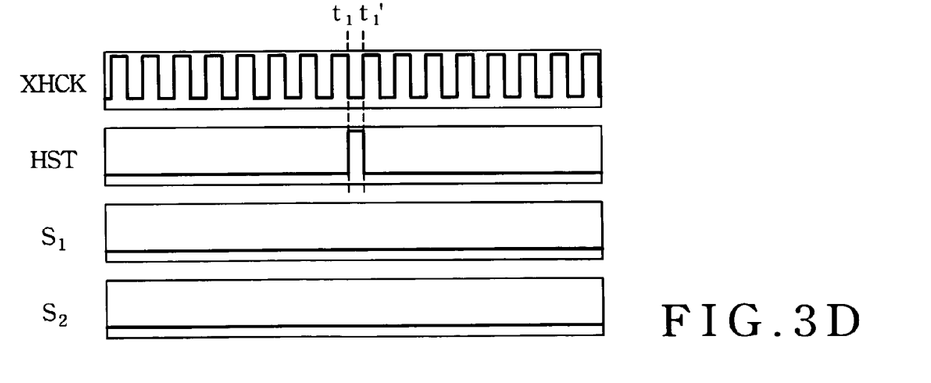
FIG. 3D shows a timing diagram of an input signal and output signal of a register circuit.

Please refer to FIG. 3D, which shows a timing diagram of an input signals and output signals of a register circuit. During a time section t to t', a first stage of the register circuit receives the HST as a pulse input and extracts the XHCK to generate a sample signal $S_1$, because the delay of signal transferring, the XHCK is a low-pulse input and the sample signal $S_1$ is not a correct one. The efficiency of sample signals affects the image quality of the LCD display seriously.

SUMMARY OF THE INVENTION

The prime objective of the present invention is to improve the signals with asynchronous phenomenon of a shift register circuit.

According to the present invention, a shift register circuit comprises a plurality of stages; a signal of the timing controller is conveyed to the shift register circuit for generating and transferring a sample signal to data latch circuit. The first stage of the shift register, comprising a disable circuit and a sample circuit, receives the signal of the timing controller and transfers a correct sample signal to the data latch circuit and next stage of the shift register. The disable circuit of first stage of the shift register receives sample signal of second stage of the shift register to stop the sampling procedure of the first stage of the shift register.

A method of improving an asynchronous signal of a display driving circuit, the driving circuit comprises a timing controller, a shift register circuit and a scan driver, the shift register circuit is composed of a plurality of stages and a plurality of data latch circuits, the method comprising: first, the timing controller providing a clock signal and a start signal; then a first stage receiving the clock signal and the start signal, while the start signal is in high pulse, the first stage extracts a next clock signal as a sample signal corresponding to the start signal for avoiding a sampling procedure uncompleted.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Figure 4:
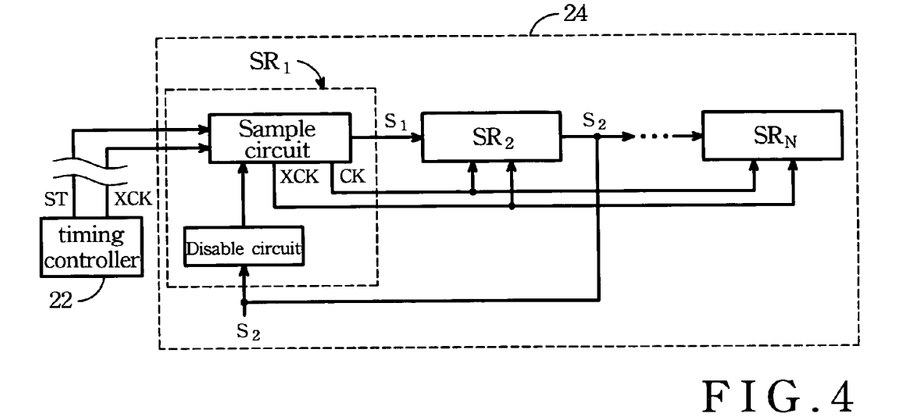
FIG. 4 shows a shift register circuit 24 of one embodiment of the in accordance with the present invention.

Please refer to FIG. 4, which shows a shift register circuit 24 of one embodiment of the in accordance with the present invention. The shift register circuit 24 comprises a plurality of stages, a first stage $SR_1$ of the shift register circuit 24 further comprises a sample circuit and a disable circuit; the first stage is controlled by a reverse clock signal (called as XCK hereinafter) and a start signal (called as ST hereinafter) outputted from a timing controller 22. The ST herein acts two different functions on the sample circuit of the first stage $SR_1$. The first one is that the ST is working as a trigger signal to trigger the sample circuit of the first stage SR1 to extract a complete sample signal, the duration time of the ST has no influence on the sampling procedure. The other one is that extracting a complete sample according to the overlapping portion of the ST and the high-pulse XCK, therefore the duration time of the ST is longer than 1.5 period of the XCK.

When the sample signal generated from the first stage $SR_1$ is fed into the data latch circuit and a second stage $SR_2$; the second stage $SR_2$ is controlled by the sample signal $S_1$, the XCK and the clock signal (called as CK hereinafter) to generate a sample signal $S_2$; and then the sample signal $S_2$ is fed into the data latch circuit, the disable circuit of the first stage $SR_1$, and a third stage. The sample signal $S_2$ drives the disable circuit of the first stage $S_1$ to stop the sampling procedure of the first stage SR1 till a next sampling procedure starts.

Figure 5A:
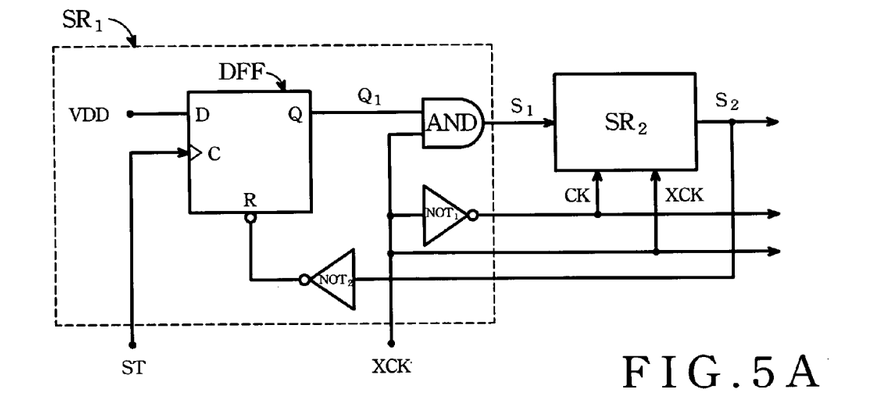
FIG. 5A shows a shift register circuit of a first embodiment in accordance with the present invention.
Figure 5B:
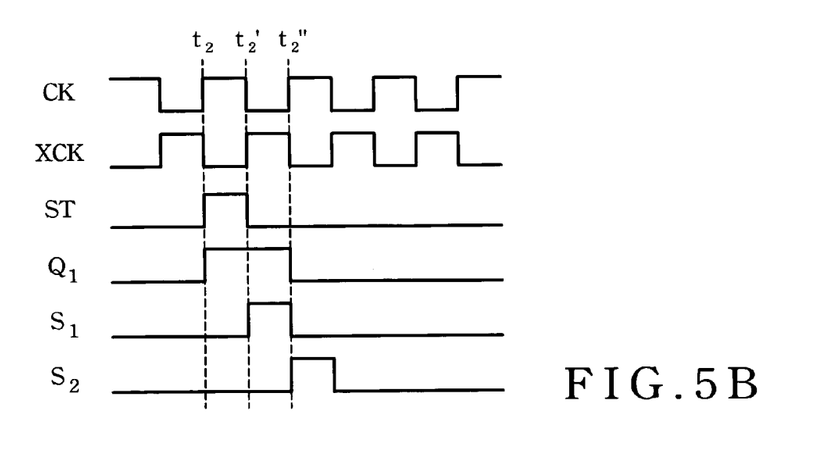
FIG. 5B shows a timing diagram of node signals corresponding to FIG. 5A.

Please refer to FIG. 5A and FIG. 5B, FIG. 5A shows a shift register circuit of a first embodiment in accordance with the present invention, and FIG. 5B shows a timing diagram of node signals corresponding to FIG. 5A. As FIG. 5A shows, the first stage SR1 is composed of a D-type flip flop (called as DFF hereinafter), two inverters (two not gates NOT1 and NOT2) and an AND.

A data input D herein connects to a reference voltage (called as $V_{DD}$ hereinafter) to keep in high potential, a clock trigger signal input C of the DFF uses a start signal from the timing controlled as a input signal, the output of the DFF outputs a signal $Q_1$ to a input of the AND, and the other input of the AND receives a XCK. The reset terminal of the DFF receives the sample signal $S_2$ of the second stage $SR_2$ that converted by the $NOT_2$, the $NOT_1$ converts the XCK to the CK and transfers the CK to follow-up stages.

While the first stage is at time $t_2$, the data input D receives a high potential from the $V_{DD}$, the start signal is fed into the terminal C at raising edge trigger status (or on status from low to high), according to the character of the DFF, the output signal $Q_1$ reveals the input potential of the DFF, therefore the output signal $Q_1$ will at status from low to high, and then fed into a input of the AND.

The AND outputs a high-pulse sample signal $S_1$ according to two input signals $Q_1$ and XCK at time $t_2$', and outputs the sample $S_1$ to the second stage $SR_2$, wherein the duration time of the high-pulse sample signal $S_1$ covers (is equivalent to) 50% period of the XCK. The second stage $SR_2$ output the sample signal $S_1$ to a next stage, the data latch circuit (not shown in the figure) and the first stage $SR_1$ at time $t_2$''. The sample signal $S_2$ passed through the inverter of the first stage SR1 is fed into the reset terminal of the DFF and then DFF is reset to change the output signal from high to low to stop the sampling procedure of the first stage $SR_1$.

Figure 6A:
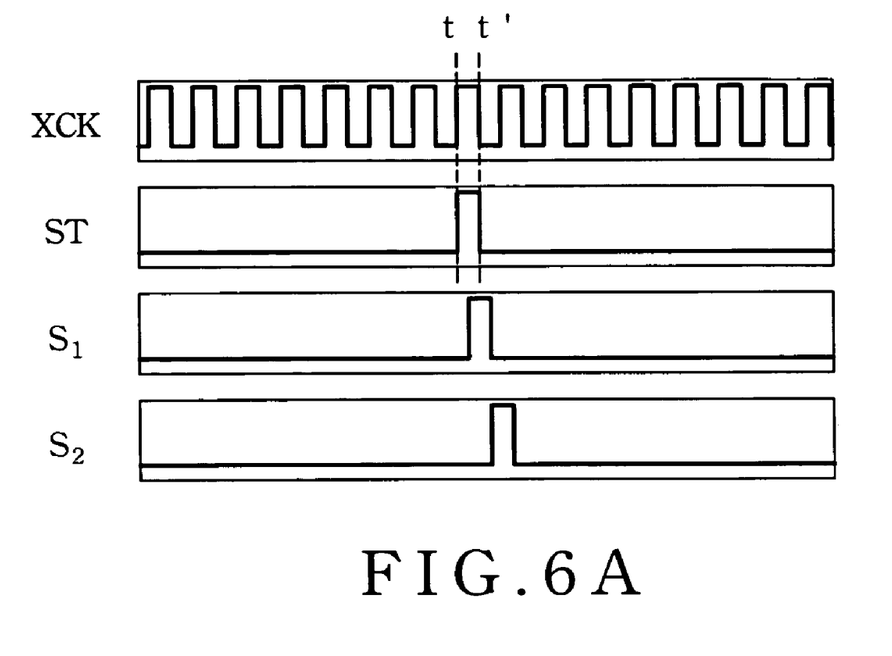
FIG. 6A is an ideal timing diagram of input signals and output signals of the first embodiment.

Please refer to FIG. 6A, which is an ideal timing diagram of input signals and output signals of the first embodiment. The shift register circuit receives the ST and the XCK, during time section t to t', the first stage $SR_1$ receives a pulse input ST and extracts the XCK at the same time to generate and transfer a sample signal $S_1$ to a corresponding data latch circuit and the second stage $SR_2$, and follow-up stages will output sample signals in turn.

Figure 6B:
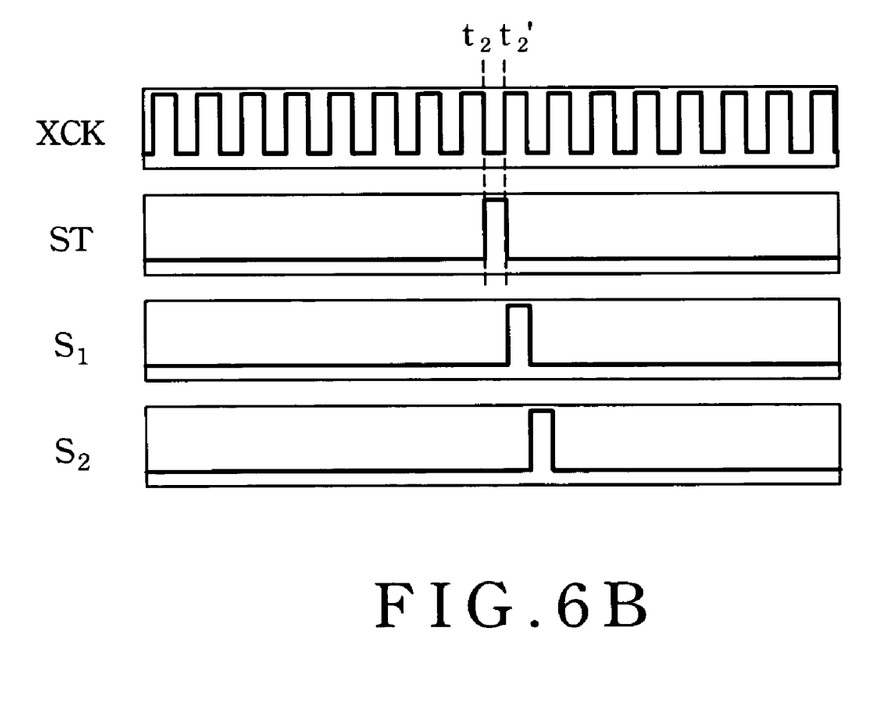
FIG. 6B shows a timing diagram of input signals and output signals of the first embodiment.

Please refer to FIG. 6B, which shows a timing diagram of input signals and output signals of the first embodiment. During a time section $t_2$ to $t_2$', the first stage $SR_1$ receives a pulse input $S_1$ and triggers the DFF to output a high potential signal (because the data input D is in high potential) to a input of the AND, the AND receives signals $Q_1$ and XCK and generates a sample signal $S_1$ during the time section $t_2$' to $t_2$'', and then transfers the sample signal $S_1$ to the next stage, and follow-up stages will output sample signals in turn.

In the shift register of the present invention, even the start signal and the clock signal are delayed during transferring processes and become asynchronous signals while feeding into the first stage, the first stage of the design circuit will make the sample signals and clock signals being synchronous to avoid affecting image quality.

Figure 7A:
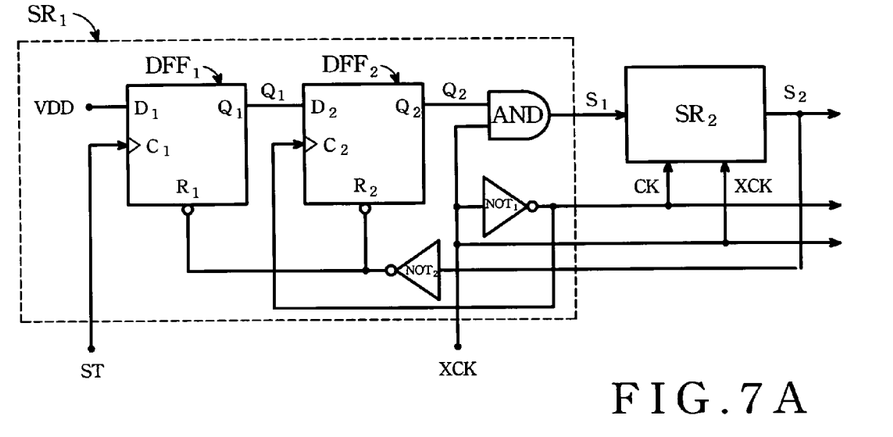
FIG. 7A shows a shift register circuit of a second embodiment in accordance with the present invention.
Figure 7B:
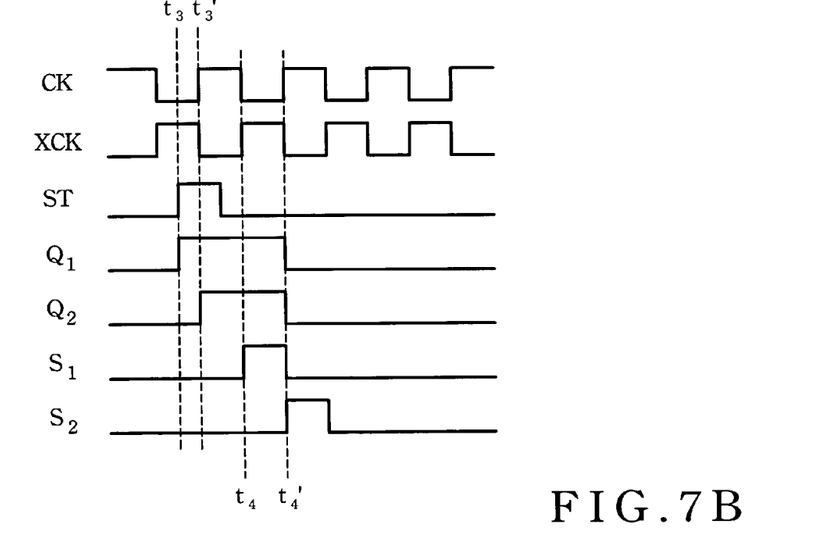
FIG. 7B shows node signals corresponding to FIG. 7A.

Please refer to FIG. 7A and FIG. 7B, FIG. 7A shows a shift register circuit of a second embodiment in accordance with the present invention, and FIG. 7B shows node signals corresponding to FIG. 7A. As FIG. 7A shows, the first stage SR1 is composed of a $DFF_1$, a $DFF_2$, a $NOT_1$, a $NOT_2$ and an AND.

The difference between the second the first embodiment is an extra $DFF_2$ disposed next to the $DFF_1$. The $Q_1$ from the $DFF_1$ fed into the data input $D_2$ of the $DFF_2$, the input signal of the clock trigger data input $C_2$ of the $DFF_2$ is CK, and the output of the $DFF_2$ output a $Q_2$ to an input of the AND, the other input of the AND receives XCK; the reset terminals of the $DFF_1$ and the $DFF_2$ receive the sample signal $S_2$ that inverted by the $NOT_2$, the other inverter $NOT_1$ inverts the XCK to the CK to transfers to follow-up stages.

While the first stage is at time t3, the data input D1 connects to the $V_{DD}$ to keep in high potential, the start signal is fed into the clock signal input $C_1$ at raising edge trigger status (or on status from low to high), the output signal $Q_1$ reveals the input potential of the input $D_1$ of the $DFF_1$, therefore the output signal $Q_1$ will on status from low to high and be fed in to the input $D_2$ of the $DFF_2$, and then fed into a input of the AND. At time $t_3$', the CK that the clock trigger data input receives is at high potential trigger status, therefore the output signal $Q_2$ of the $DFF_2$ is a high potential output, the output signal $Q_2$ will at status from low to high, and then fed into a input of the AND.

The AND outputs a high-pulse sample signal $S_1$ according to two input signals $Q_2$ and XCK during the time section $t_4$ to $t_4$', and outputs the sample $S_1$ to the second stage $SR_2$, wherein the duration time of the high-pulse sample signal $S_1$ covers (is equivalent to) 50% period of the XCK. The second stage $SR_2$ output the sample signal $S_1$ to a next stage, the data latch circuit (not shown in the figure) and the first stage $SR_1$ at time $t_4$'. The sample signal $S_2$ passed through the $NOT_2$ is fed into the reset terminals $R_1,R_2$ of the $DFF_1$ and the $DFF_2$, the $DFF_1$ and the $DFF_2$ are reset to change the output signals $Q_1$ and $Q_2$ from high to low to stop the sampling procedure of the first stage $SR_1$.

In the present invention the type of the flip flop is not a limitation, the mentioned two embodiments a positive edge trigger-a D-type flip flop is selected to start a sampling procedure at the high-potential rigger status; other edge trigger flip flop could be applied in the present invention, for instance, a negative edge trigger could be selected to be a substitute.

Figure 8A:
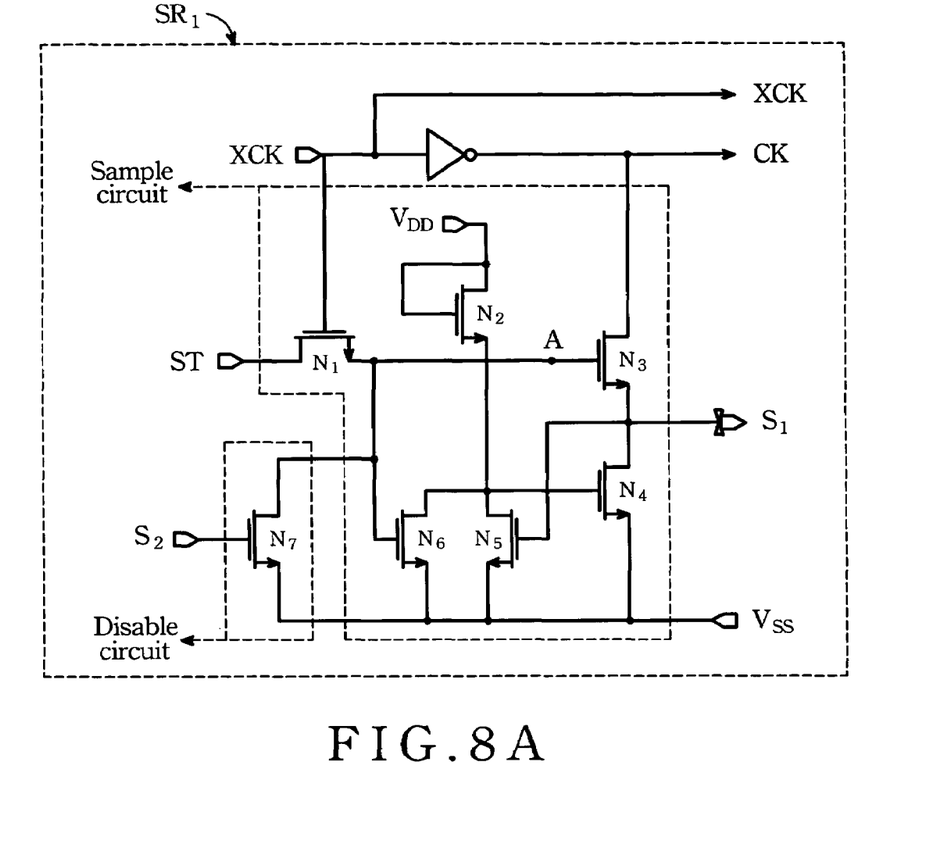
FIG. 8A shows a circuit diagram of a first stage of a third embodiment in accordance with the present invention.
Figure 8B:
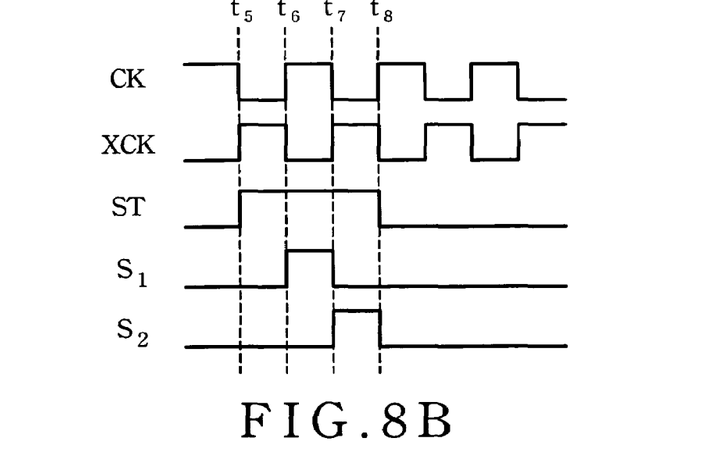
FIG. 8B shows a timing diagram of node signals corresponding to FIG. 8A.

Please refer to FIG. 8A and FIG. 8B, FIG. 8A shows a circuit diagram of a first stage of a third embodiment in accordance with the present invention, and FIG. 8B shows a timing diagram of node signals corresponding to FIG. 8A. As FIG. 8A shows, the first stage SR1 is composed of seven transistors, the transistor is not a limitation, a NMOS transistor or a PMOS transistor all could be applied herein. If a NMOS transistor is applied, the first power source $V_{DD}$ is high potential and the second power source $V_{SS}$ is low potential; but if a PMOS transistor is applied, the first power source $V_{DD}$ is low potential and the second power source $V_{SS}$ is high potential, in the third embodiment, a NMOS transistor is applied.

The first stage comprises a first transistor $N_1$, the gate of the first transistor $N_1$ couples to the XCK, the drain of the first transistor N1 couples to the timing controller (not shown in the figure) to output the ST, and the source of the first transistor $N_1$ connects to the gate of the third transistor N3, the gate of the sixth transistor N6 and the drain of the seventh transistor $N_7$. The source of the first transistor $N_1$ connects to the gate of the third transistor $N_3$ to form a node A. The drain and the gate of the second transistor $N_2$ connect to the first power source $V_{DD}$ in commonly, the source of the second transistor $N_2$ connects to the gate of the fourth transistor $N_4$, the drain of the fifth transistor N5 and the drain of the sixth transistor $N_6$. The drain of the third transistor N3 couples to the CK, the source of the transistor $N_3$ connects to the drain of the fourth transistor N4 and the gate of the fifth transistor $N_5$. The join of the source of the third transistor $N_3$ and the drain of the forth transistor $N_4$ is an output of the first stage; the sources of the forth, the fifth, the sixth and the seventh transistor all connect to the second power source $V_{SS}$. The seventh transistor functions as a disable circuit of the first stage, and the gate thereof couples to the output of the second stage.

At time $t_5$, the gate of the first transistor $N_1$ receives a high pulse XCK to conduct the first transistor $N_1$, the drain thereof receives the high pulse ST to further conduct the third transistor $N_3$ through the node A; in the meanwhile, the potential of the node A is the same as that of the ST, the node A is at a floating state, at time $t_5$, through the feed-though voltage drop principle, while the CK is at high potential, the potential will become higher to keep the voltage drop between the gate of the third transistor $N_3$ and the source of the first transistor N1, and the third transistor is still a turns-on transistor. During a time section $t_6$ to $t_7$, the high pulse CK passes through the third transistor $N_3$ and output a sample signal $S_1$ to the next stage to let the follow-up stages sampling in turn. At time $t_7$, the second stage SR$_2$ (not shown in the figure) starts the sampling procedure, in the meanwhile, the gate of the seventh transistor receives the high pulse sample signal $S_2$ from the second stage and switches the node A to ground to turn off the third transistor $N_3$, then the sampling procedure of the first stage is stopped to stop outputting the high pulse sample signal $S_1$.

Figure 9A:
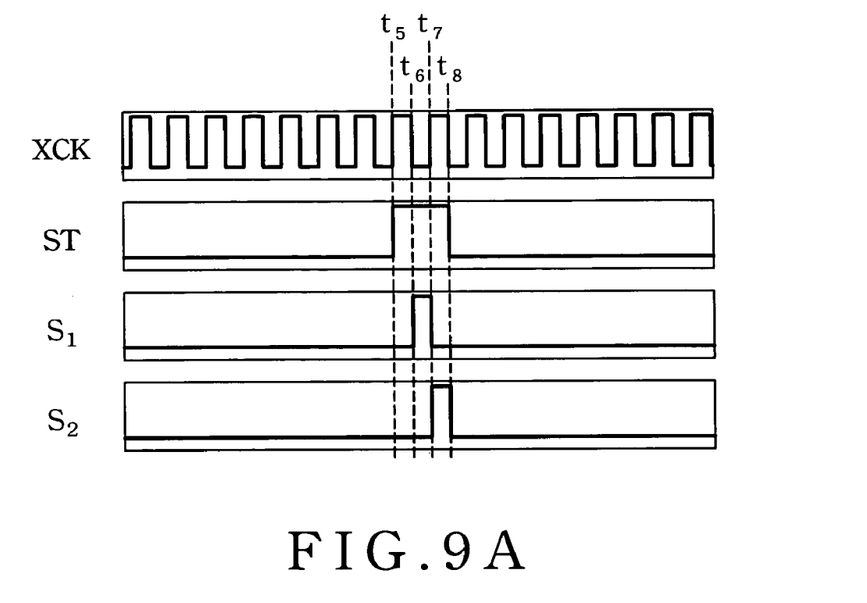
FIG. 9A, which is a timing diagram of input signals and output signals of the first stage in FIG. 8A.

Please refer to FIG. 9A, which is a timing diagram of input signals and output signals of the first stage in FIG. 8A.

The first stage SR$_1$ receives a pulse input ST to drive the sampling procedure at time $t_5$, according to mentioned sampling principle, during a time section $t_6$ to $t_7$, the first stage will generate and output a sample signal $S_1$ to a corresponding data latch circuit and the second stage. The second stage then generates the sample signal $S_2$ and fed it into a corresponding data latch circuit, the next stage, and the disable circuit of the first stage to stop the sampling procedure of the first stage. Therefore, during the time section $t_7$ to $t_8$, the first stage won't extract any signal.

Figure 9B:
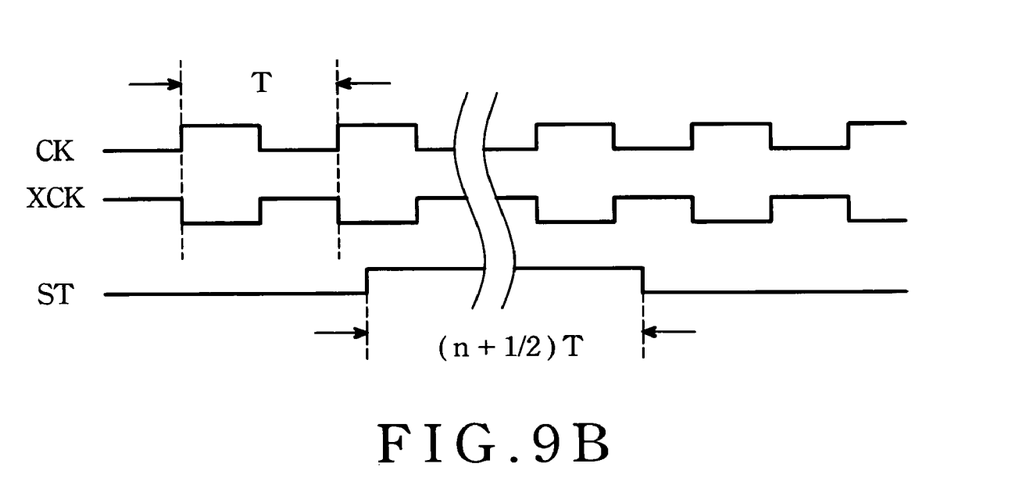
FIG. 9B shows a timing diagram of nodes in FIG. 9A.

The duration time of the start signal ST may be changed in the third embodiment. FIG. 9B shows a timing diagram of nodes in FIG. 9A. The working period of the XCK received by the shift register circuit is defined as T, and the duration time of the ST is defined as (n+1/2)T, herein n is a natural number. In mentioned embodiment that n=1, the first stage receives only one sample signal $S_2$ to stop the sampling procedure; however, with the time duration of the ST increase, the first stage will change to receive more sample signals from $S_2$ to $S_m$, herein m is not smaller than the value n+1. This circuit design will avoid mistakes of repeat sampling of the first stage.

For instance, while n=5, the duration time of the ST is 5.5 T, and the disable circuit of the first stage has to be designed to receive at least sample signals $S_2$~$S_6$ from the second stage to the sixth stage. According to mentioned principles, because the duration time of the ST is much longer than the period of the XCK, hence no matter how serious the delay phenomenon between the ST and the XCK, there's at least one complete high-pulse XCK (XCK=1) inputting the sample circuit of the first stage with a complete high-pulse ST (ST=1) at the same time, and then the sample signal S1 will be a complete high-pulse signal, hence the sample circuit may work normally. In this situation, there's might be XCK and ST with multiple periods fed into the disable circuit of the first stage and results the first stage outputting the sample signal repeat, hence the disable circuit is needed for receiving sample signals from stages other than the first stage to stop the sampling procedure of the first stage and further stop the repeat sampling of the first stage.

Figure 10:
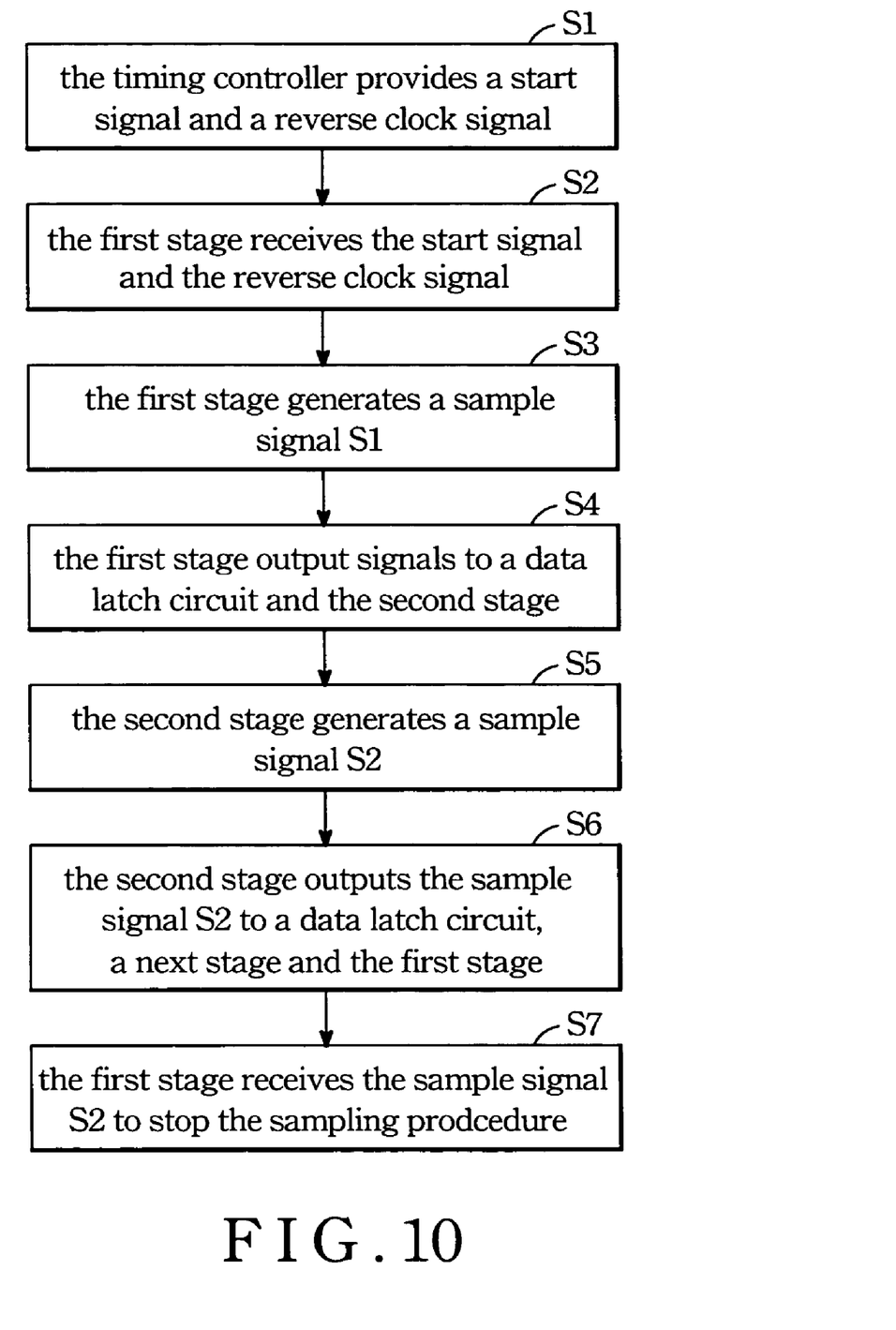
FIG. 10 shows a flow chart that how to produce synchronous driving circuit signals of one embodiment according to the present invention.

Please refer to FIG. 10, which shows a flow chart that how to produce synchronous driving circuit signals of one embodiment according to the present invention. The driving circuit of the display comprises a timing controller, a data driver and a scan driver. The data driver comprises a shift register circuit and a plurality of data latch circuits, and the shift register circuit is composed of a plurality of stages.

The method of improving asynchronous signals of a driving circuit comprises following steps:

Step 1 (S1): the timing controller provides a reverse clock signal and a start signal to the scan driver and the data driver;

Step 2 (S2): the first stage of the shift register receives the start signal and the reverse clock signal;

Step 3 (S3): while the start signal is in high potential, the first stage extracts a next clock signal having a 50% working period as the duration time of a sample signal $S_1$;

Step 4 (S4): outputting the synchronous start signal $S_1$, the clock signal and the reverse clock signal to a corresponding data latch circuit and the second stage;

Step 5 (S5): the second stage receives the sample signal S1 of the first stage and generates a sample signal $S_2$;

Step 6 (S6): outputting the sample signal $S_1$ of the second stage to a corresponding data latch circuit and the next stage, and feedback to the disable circuit of the first stage;

Step 7 (S7): the first stage stops the sampling procedure through the sample signal $S_2$, hence a repeat sampling could be avoid, and getting a correct sample signal. In step 7; the first stage of the design circuit is varied corresponding to varied duration time of the ST to keep synchronous output signals of the first stage.

In the embodiments mentioned in the present invention, a clock signal is used for a reference signal in a two-phase shift register circuit, however, in practically, either a single-phase shift register circuit or a multi-phase shift register circuit could be applied herein. Additionally, the description about the first stage receiving the start signal and the reverse clock signal could be changed to receiving the start signal and the clock as the sample signal.

Comparing to the conventional shift register circuit, the first stage of the present invention further comprises a disable circuit (the reset terminals in the first and the second embodiments and the seventh transistor N₇ in the third embodiment). Even the asynchronous phenomenon happened on the start signal and the clock signal, the circuit design of the first stage will make the output signals being synchronous. The second stage to the $N_{th}$ stage of the shift register circuit could use conventional circuit design.

According to the present invention, the first stage receives a start signal and a clock signal from the timing controller and then generates a start signal and a sample synchronous to a reverse clock signal. And then follow-up stages may output signals according the synchronous reverse clock signal, the clock signal and the sample sequentially. Moreover, the first stage further needs output of other stages or itself to regulate the synchronous signals.

While the present invention has been particularly shown and described with reference to a preferred embodiment, it will be understood by those skilled in the art that various changes in form and detail may be without departing from the spirit and scope of the present invention.

We claim:

1. A shift register circuit comprising a plurality of stages, generating and transferring a sample signal to a data latch circuit according to a signal of a timing controller, the shift register circuit comprising:
   a first stage coupled to the timing controller and the data latch circuit, the first stage further comprising a disable circuit and a sample circuit for receiving the signal of the timing controller, extracting a correct sample signal and transferring the correct sample signal to the data latch circuit and next stage of the shift register; and
   a second to $N_{th}$ stages comprising a sample circuit respectively, these stages are series connected and coupled to the first stage;
   wherein the disable circuit of the first stage receives a sample signal of the second stage to stop a sampling procedure of the sample circuit of the first stage.

2. The shift register circuit of claim 1, wherein the first stage is composed of a flip flop and a plurality of logic elements, the sampling procedure of the first stage is stopped by a reverse sample signal of the second stage feeding into a reset terminal of the flip flop.

3. The shift register circuit of claim 1, wherein the first stage is composed of two flip flops connected in series and a plurality of logic elements, the sampling procedure of the first stage is stopped by a reverse sample signal of the second stage feeding into reset terminal of the two flip flops.

4. The shift register circuit of claim 1, the disable circuit of the first stage further comprises a n-type transistor, wherein a source of the n-type transistor connected to the sample circuit of the first stage, a drain of the n-type transistor connected to ground, and a gate of the n-type transistor connected to the sample circuit of the second stage, while the sample signal of the second stage is in high-pulse, the n-type transistor switches the sample circuit of the first stage to ground to stop the sampling procedure of the first stage.

5. The shift register of claim 4, wherein the timing controller provides a start signal and a clock signal, the period of the clock signal is T, and the period of the start signal is (N+1/2)*T, N is a natural number herein.

6. A driving circuit of a display device comprising:
   a timing controller;
   a data driver coupled to the timing controller and having a shift register circuit, wherein the shift register comprises a plurality of stages, a first stage of the shift register circuit extracts a correct sample signal according to a signal of the timing controller and makes other stages work sequentially; and
   a scan driver coupled to and controlled by the timing controller,
   wherein the performance of the display device is driven and controlled by signals provided by the data driver and the scan driver.

7. The driving circuit of claim 6, wherein the first stage is composed of a flip flop and a plurality of logic elements, a sampling procedure of the first stage is stopped by a reverse sample signal of a second stage feeding into a reset terminal of the flip flop.

8. The driving circuit of claim 6, wherein the first stage is composed of two flip flops connected in series and a plurality of logic elements, the sampling procedure of the first stage is stopped by a reverse sample signal of a second stage feeding into reset terminal of the two flip flops.

9. The driving circuit of claim 6, a disable circuit of the first stage further comprises a n-type transistor, wherein a source of the n-type transistor connected to the sample circuit of the first stage, a drain of the n-type transistor connected to ground, and a gate of the n-type transistor connected to the sample circuit of the second stage, while a sample signal of a second stage is in high-pulse, the n-type transistor switches the sample circuit of the first stage to ground to stop the sampling procedure of the first stage.

10. The driving circuit of claim 9, wherein the timing controller provides a start signal and a clock signal, the period of the clock signal is T, and the period of the start signal is (N+1/2)*T, N is a natural number herein.

11. A method of improving an asynchronous signal of a display driving circuit, the driving circuit comprising a timing controller, a shift register circuit and a scan driver, wherein the shift register circuit is composed of a plurality of stages and a plurality of data latch circuits, the method comprising:
    the timing controller providing a clock signal and a start signal;
    a first stage receiving the clock signal and the start signal, while the start signal is in high pulse, the first stage extracts a next clock signal as a sample signal corresponding to the start signal for avoiding a sampling procedure uncompleted.

12. The method of claim 11, wherein the sample signal extracted by the first stage is fed into the second stage and the data latch circuit of the first stage.

13. The method of claim 12 further comprising outputting a signal to a corresponding data latch circuit, a third stage, and a first stage after the second stage receiving the sample signal of the first stage.

14. The method of claim 13 further comprising stopping the sampling procedure of the first stage after the first stage receiving the signal of the second stage.

* * * * *